United States Patent [19]

Kuo

[11] Patent Number: 5,092,266
[45] Date of Patent: Mar. 3, 1992

[54] SOLDER LEVELER

[76] Inventor: Ming-Hong Kuo, Fl 7, No. 239, Sec. 3, Chung Hsiao E. Road, Taipei, Taiwan

[21] Appl. No.: 536,778

[22] Filed: Jul. 16, 1990

[51] Int. Cl.$^5$ .............................. B05C 3/09
[52] U.S. Cl. ................... 118/425; 118/426; 118/503; 228/40
[58] Field of Search ............ 118/423, 425, 426, 503; 228/36, 40

[56] References Cited

U.S. PATENT DOCUMENTS

| | | | |
|---|---|---|---|
| 2,722,197 | 11/1955 | Rubert | 118/423 |
| 4,408,560 | 10/1983 | Caratsch | 118/425 |
| 4,895,101 | 1/1990 | Knorr | 118/425 |

Primary Examiner—Michael Wityshyn
Attorney, Agent, or Firm—Morton J. Rosenberg; David I. Klein

[57] ABSTRACT

This invention relates to a solder leveler and in particular to one including a solder trough assembly having a container, two blowing means and two angular frames, two pneumatic rods mounted on the angular frames and having an elongated case in which there are mounted a horizontal pneumatic cylinder and a plurality of pneumatic cylinders, two conveyer belts mounted at two sides of the solder trough assembly, a jig fitted on the solder trough assembly, an elevated device for moving the jig upwards and downwards, and a revolving means for rotating the jig whereby the printed circuit board is first fed by the first conveyer belt into a clamping unit of the jig, then moved up to an appropriate height by the elevated device, rotated downwards by the revolving means, lowered down into the container for soldering, lifted up from the container, blown by the blowing means so as to remove excess solder thereon, rotated upwards by the revolving means to a horizontal position, released by the jig, and delivered by the second conveyer.

1 Claim, 10 Drawing Sheets

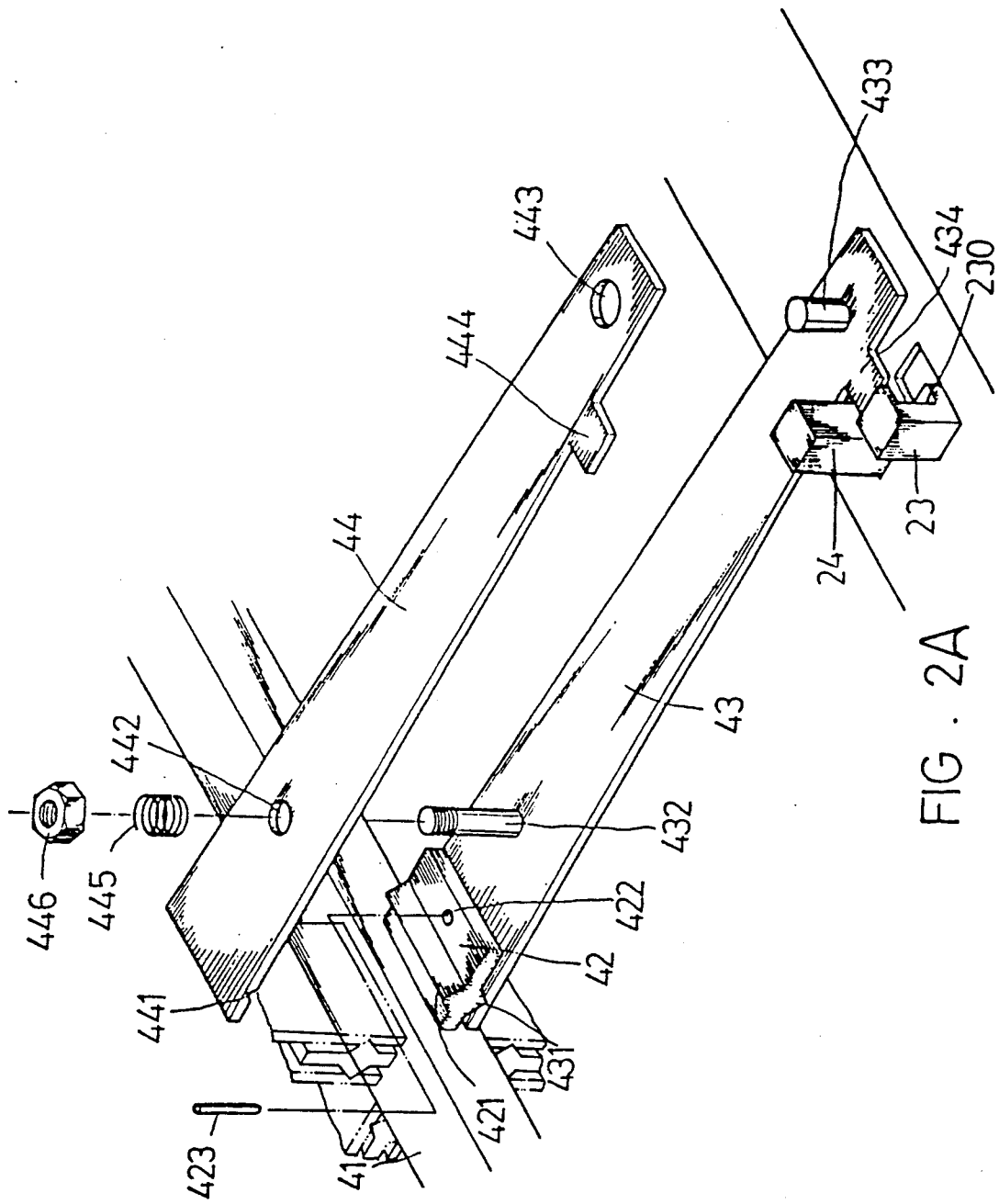

SOLDER LEVELER

BACKGROUND OF THE INVENTION

It is found that the prior art solder leveler requires a manual action to fix a printed circuit board on a clamp thereby increasing the labor cost and wasting time as well (see FIGS. 9 and 10).

Therefore, it is an object of the present invention to provide an automatic solder leveler which may obviate and mitigate the above-mentioned drawbacks.

SUMMARY OF THE INVENTION

This invention relates to an improved solder leveler.

It is the primary object of the present invention to provide a solder leveler which is fully automatic and does not require manual handling of the printed circuit board during the soldering process.

It is another object of the present invention to provide a solder leveler which is simple in construction.

It is still another object of the present invention to provide a solder leveler which is economic to produce.

Other objects and merits and a fuller understanding of the present invention will be obtained by those having ordinary skill in the art when the following detailed description of the preferred embodiment is read in conjunction with the accompanying drawings.

BRIEF DESCRIPTION OF THE DRAWINGS

FIG. 2A shows is an exploded view of a jig of the solder leveler;

DETAILED DESCRIPTION OF THE PREFERRED EMBODIMENT

Figure 1:
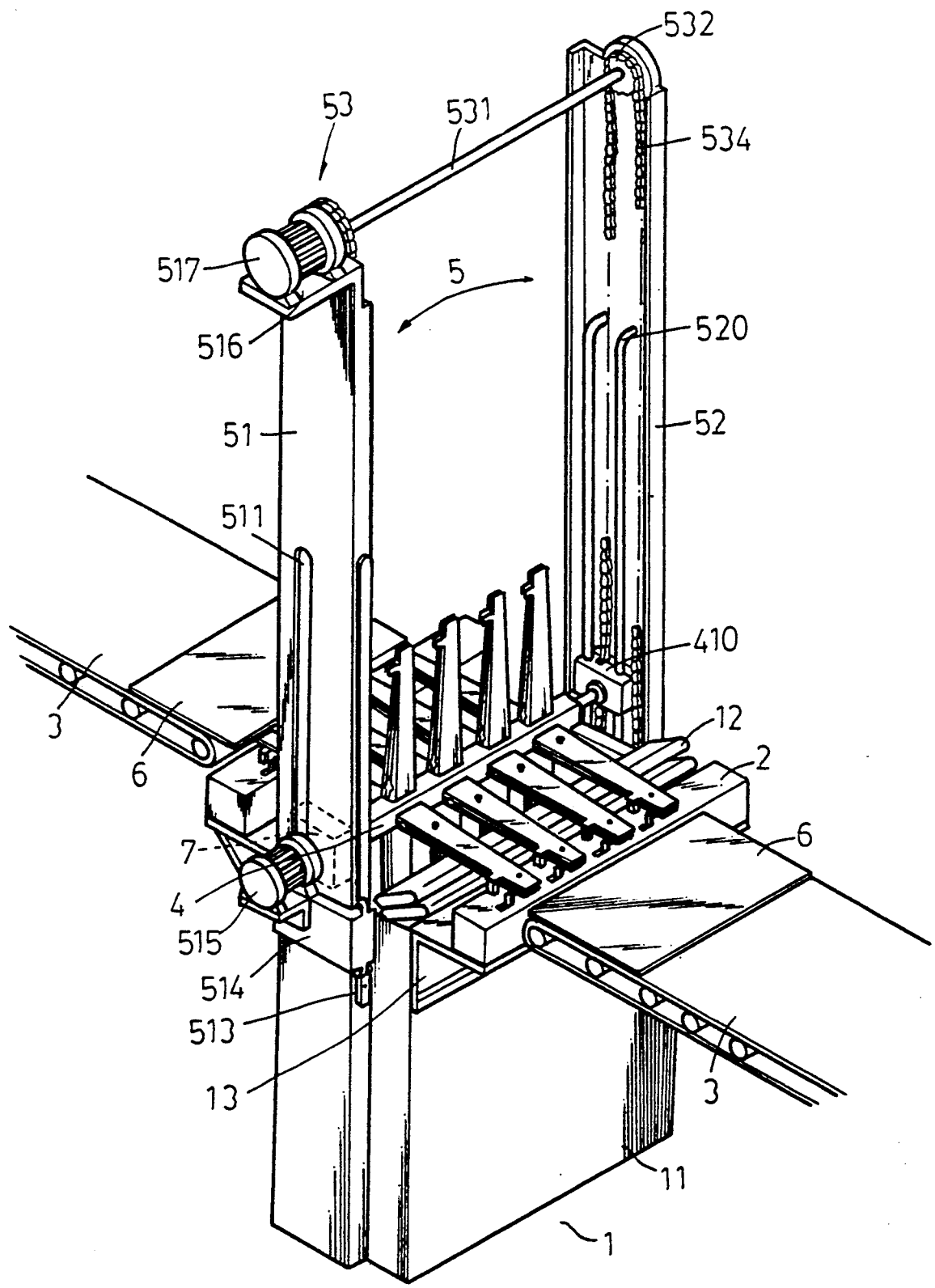
FIG. 1 is a perspective view of a solder leveler according to the present invention.
Figure 2B:
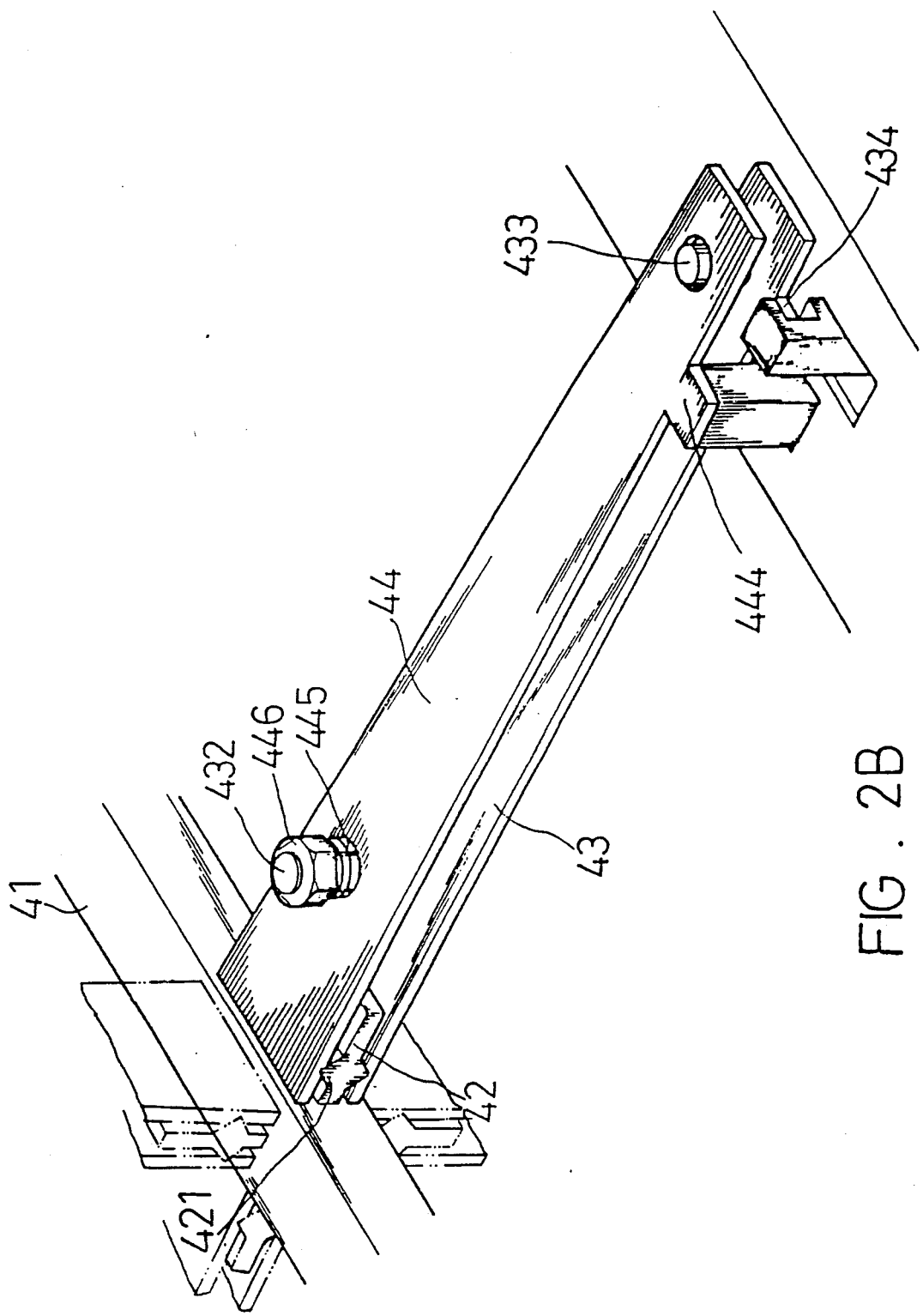
FIG. 2B is a perspective view of the jig of the solder leveler.
Figure 3A:
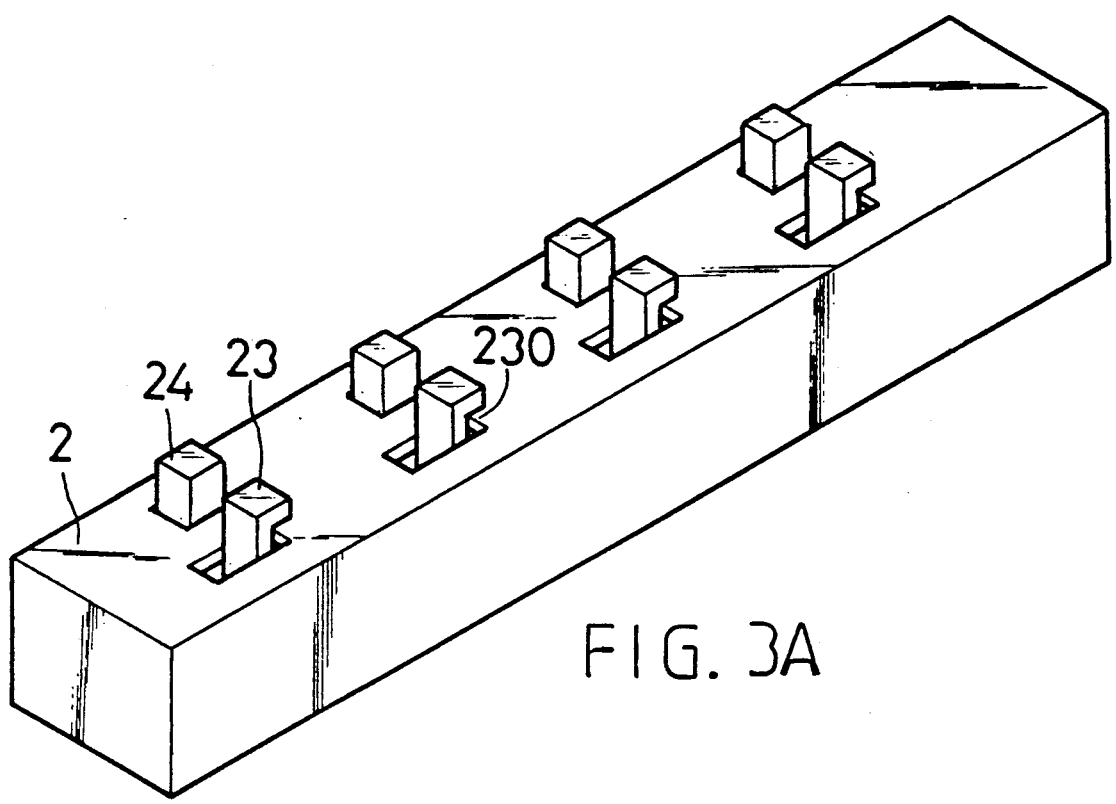
FIG. 3A is a perspective view of a pneumatic rod of the solder leveler.
Figure 3B:
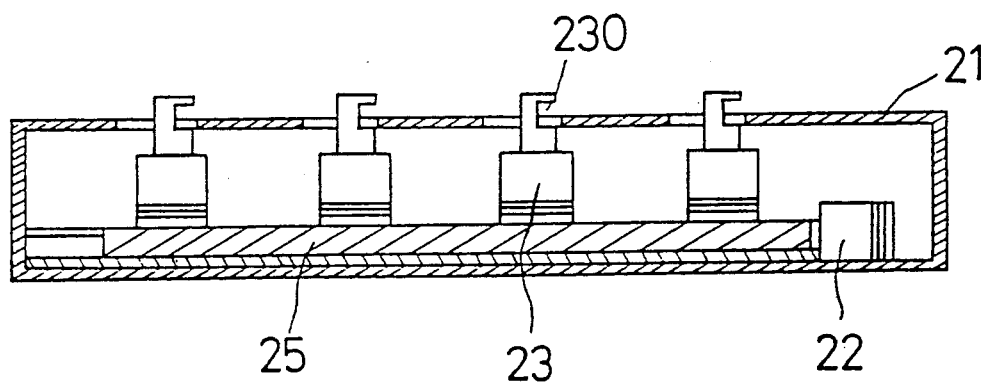
FIG. 3B is a sectional view of the pneumatic rod of the solder leveler.
Figure 4:
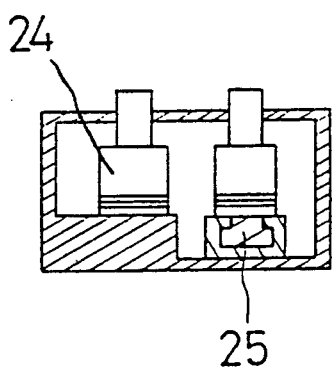
FIG. 4 is another sectional view of the pneumatic rod of the solder leveler.
Figure 5:
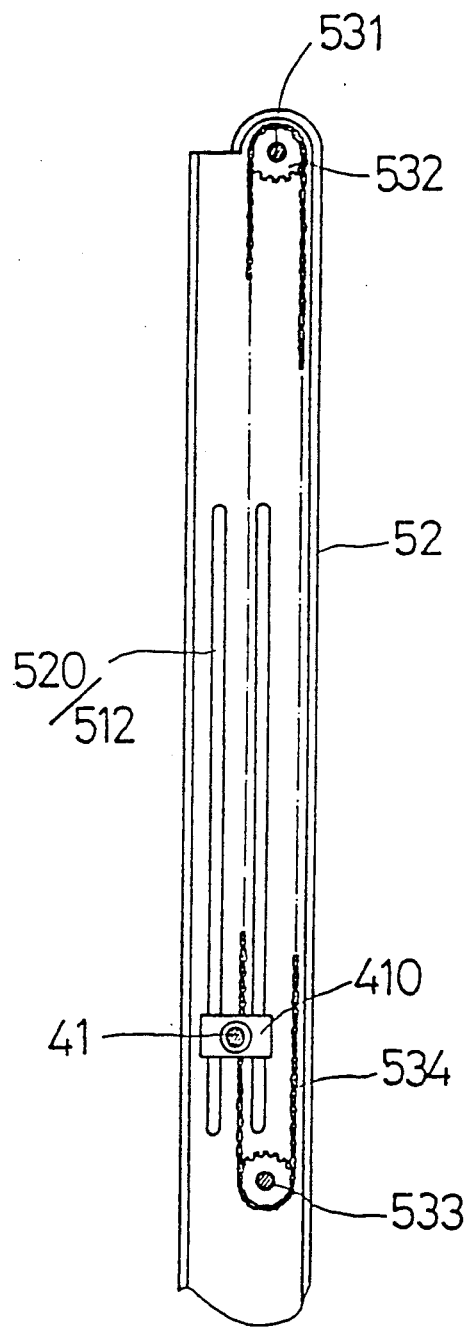
FIG. 5 shows the structure of an elevated device of the solder leveler.

With reference to the drawings and in particular to FIG. 1 thereof, the solder leveler according to the present invention mainly comprises a tinning trough assembly 1, two pneumatic rods 2, two conveyer belts 3, a jig 4, an elevated device 5 and two revolving means 7. The solder leveler assembly 1 is constituted by a container 11, two blowing means 12 and two angular frames 13. The container 11 is a rectangular case which is open at the top and made of a heat resistant material so as to receive high-temperature fused solder. The two blowing means 12 are arranged at opposite sides above the top of the container 11 so that the blowing means 12 may blow away the excess tin attached on the printed circuit board 6 when lifted up from the container 11.

The two angular frames 13 are each mounted at one side of the container 11 for supporting the pneumatic rods 2.

The pneumatic rod 2 includes an elongated case rigidly fixed on the angular frame 13; in which there are mounted a horizontal pneumatic cylinder 22, a sliding member 25 engaged with the horizontal pneumatic cylinder 22, four downward-moving pneumatic cylinders 23 mounted on the sliding member 25 so that they may be moved in unison, and four upward-moving pneumatic cylinders 24 mounted in fixed position.

The jig 4 is composed of a shaft 41 and four clamping units each having four arms 42, four lower clamps 43 and four upper clamps 44. The shaft 44 is square in cross section and rounded at both ends for engaging a chain moving block 410 and the revolving means 7. The four arms 42 are integrally or otherwise formed at one side of the shaft 41 and are each provided with a protuberance 421 at the middle of both sides and a hole 422 near the outer edge for connecting a pin 423. The lower clamp 43 is an elongated plate which is provided with a recess 431 adapting to receive the protuberance 421 of the arm 42, a bolt 432 vertically mounted thereon, a positioning pin 433 vertically mounted thereon and a projection 434 engaged with a slot 230 of the downward-moving pneumatic cylinder 23. The upper clamp 44 is also an elongated member similar to the lower clamp 43, which is provided with a recess 441 adapting to receive the protuberance 421 of the arm 42, a first hoe 442 for the passage of the first bolt 432 of the lower clamp 43, a second hole 443 for the passage of the positioning pin 433, and a projection 444 located above the upward-moving pneumatic cylinder 24. The first bolt 432 of the lower clamp 43 is engaged with a nut 446 with a spring between the nut 446 and the upper surface of the upper clamp 44 so as to render the jig 4 a clamping function. The positioning pin 443 is designed for preventing the printed circuit board 6 from excessively going into the jig 4.

The elevated device 5 mainly consists of a left rack 51, a right rack 52 and a transmission means 53. The left rack 51 is vertically mounted at the left side of the tinning trough assembly 1 and has a longitudinal groove 511 thereon and two guides 512 on the inner side thereof. The chain moving block 410 of the jig 4 is mounted on the guides 512. A sliding guide 513 is arranged at both sides of the left rack 51 so that a bracket 514 may move therealong. A motor 515 is mounted on the bracket 514 with its axle connected with the shaft 41 of the jig 4. A second bracket 516 is fitted on the top of the left rack 51 for fixing a second motor 517. The right rack 52 is provided with two guides 520 for engaging the chain moving block 410 of the jig 4. The transmission mechanism 53 includes a shaft 531 connecting two upper gears 532 on the top of the right rack 52 and left rack 51. A lower gear 533 is disposed at the lower part of the left and right racks 52. A chain 534 is engaged with the upper and lower gears 532 and 533 so that the jig 4 may be moved up and down.

Figure 6:
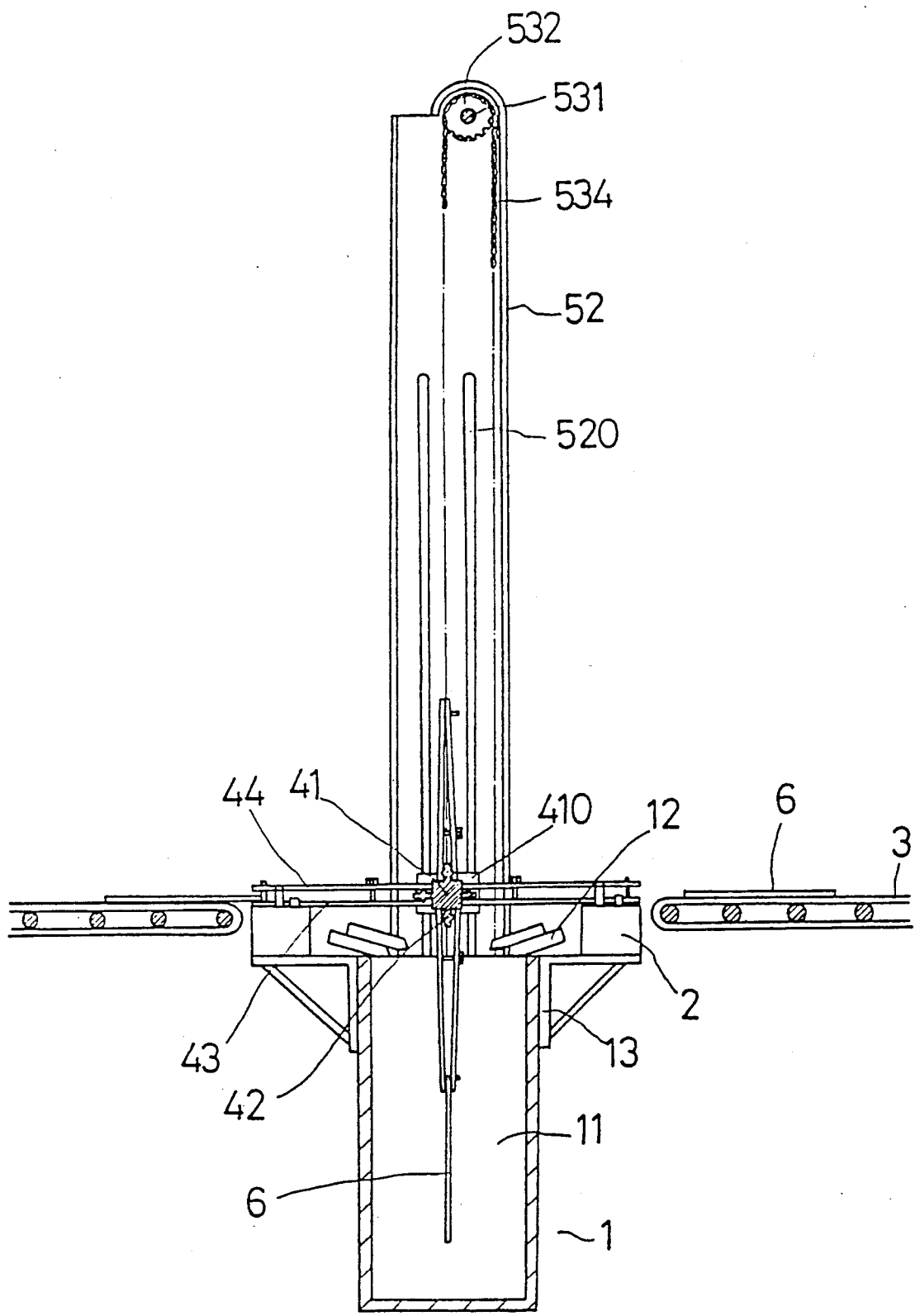
FIG. 6 shows the principle of the solder leveler.
Figure 7:
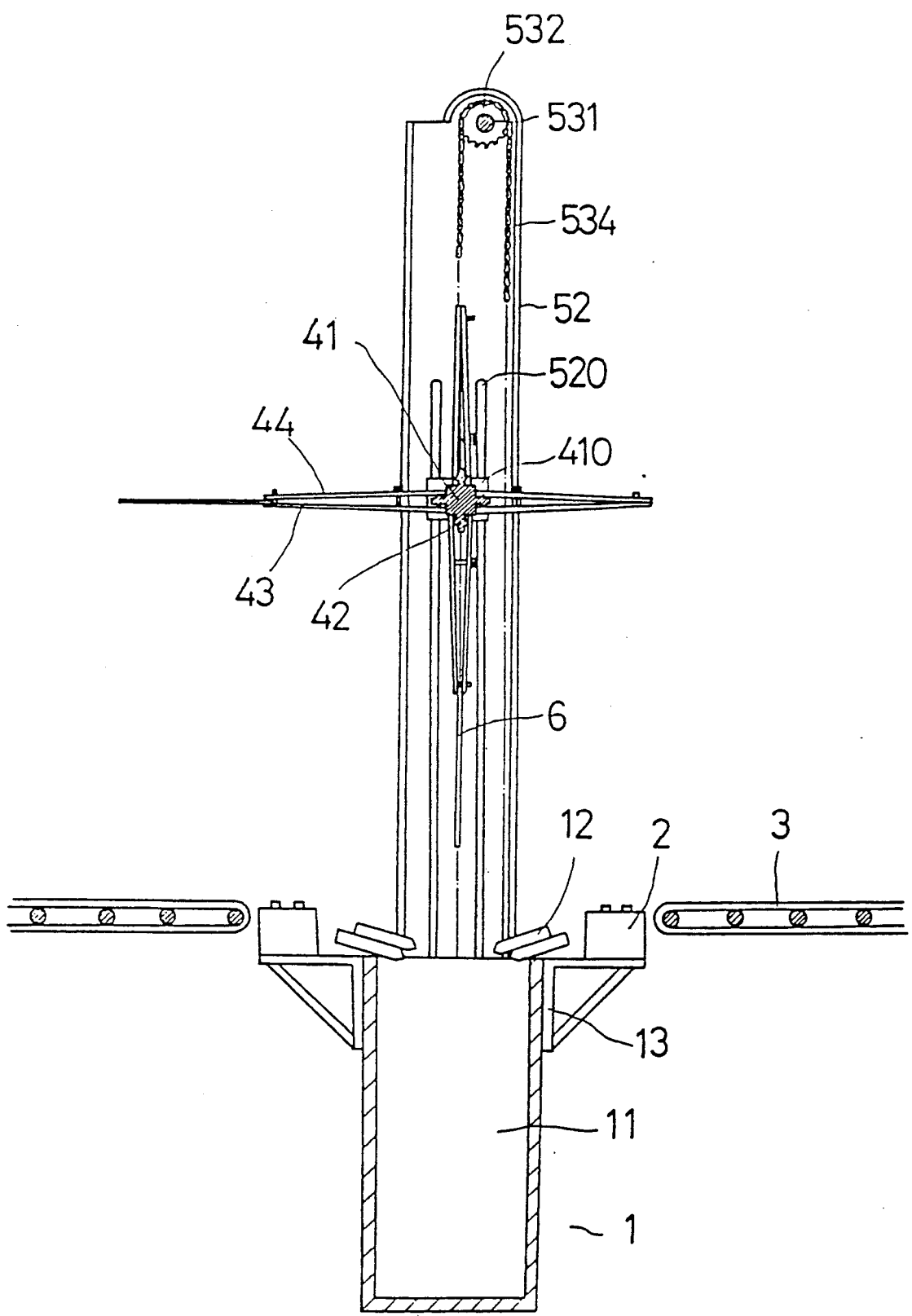
FIG. 7 shows the principle of the solder leveler.
Figure 8:
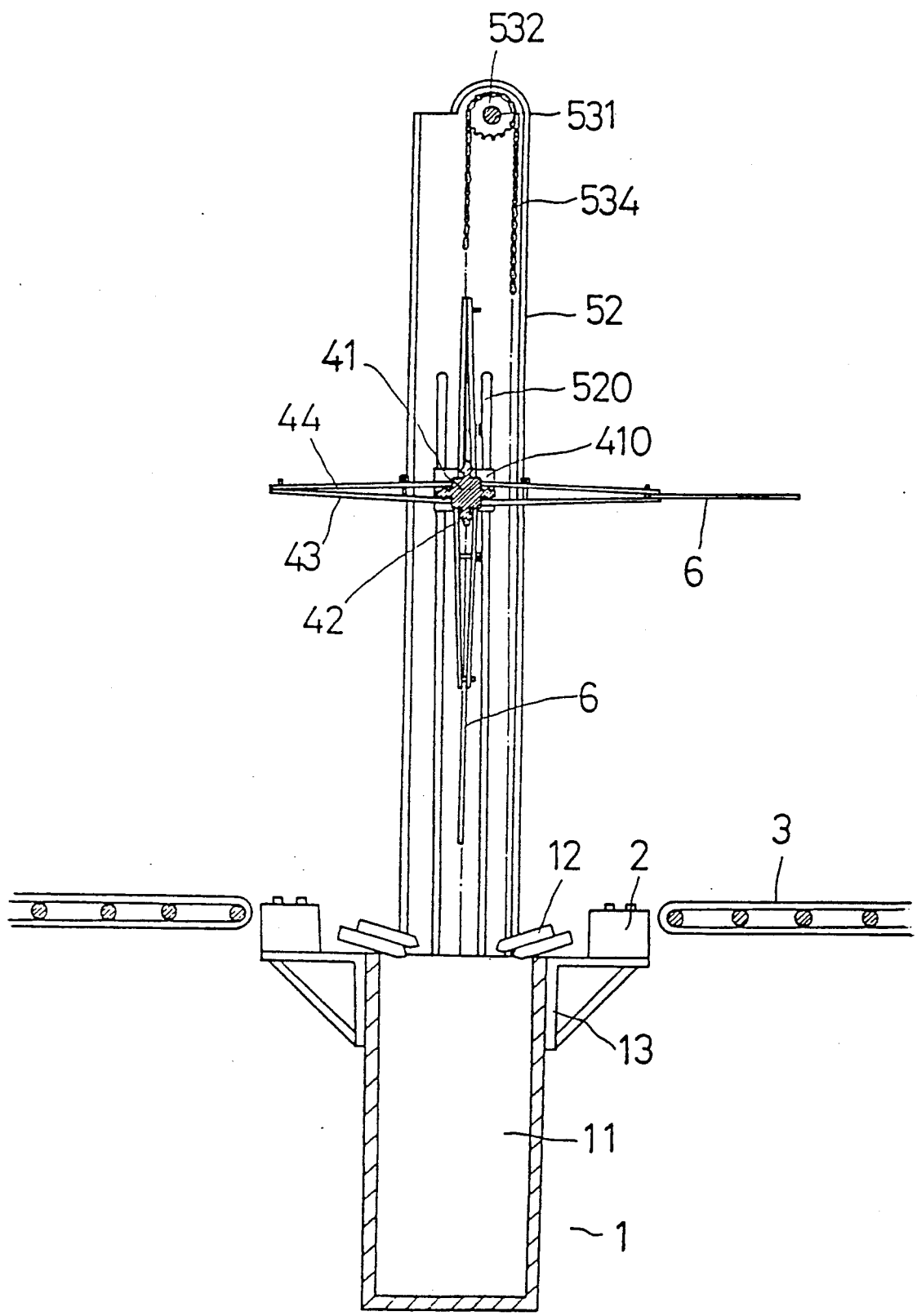
FIG. 8 shows the principle of the solder leveler.
Figure 9:
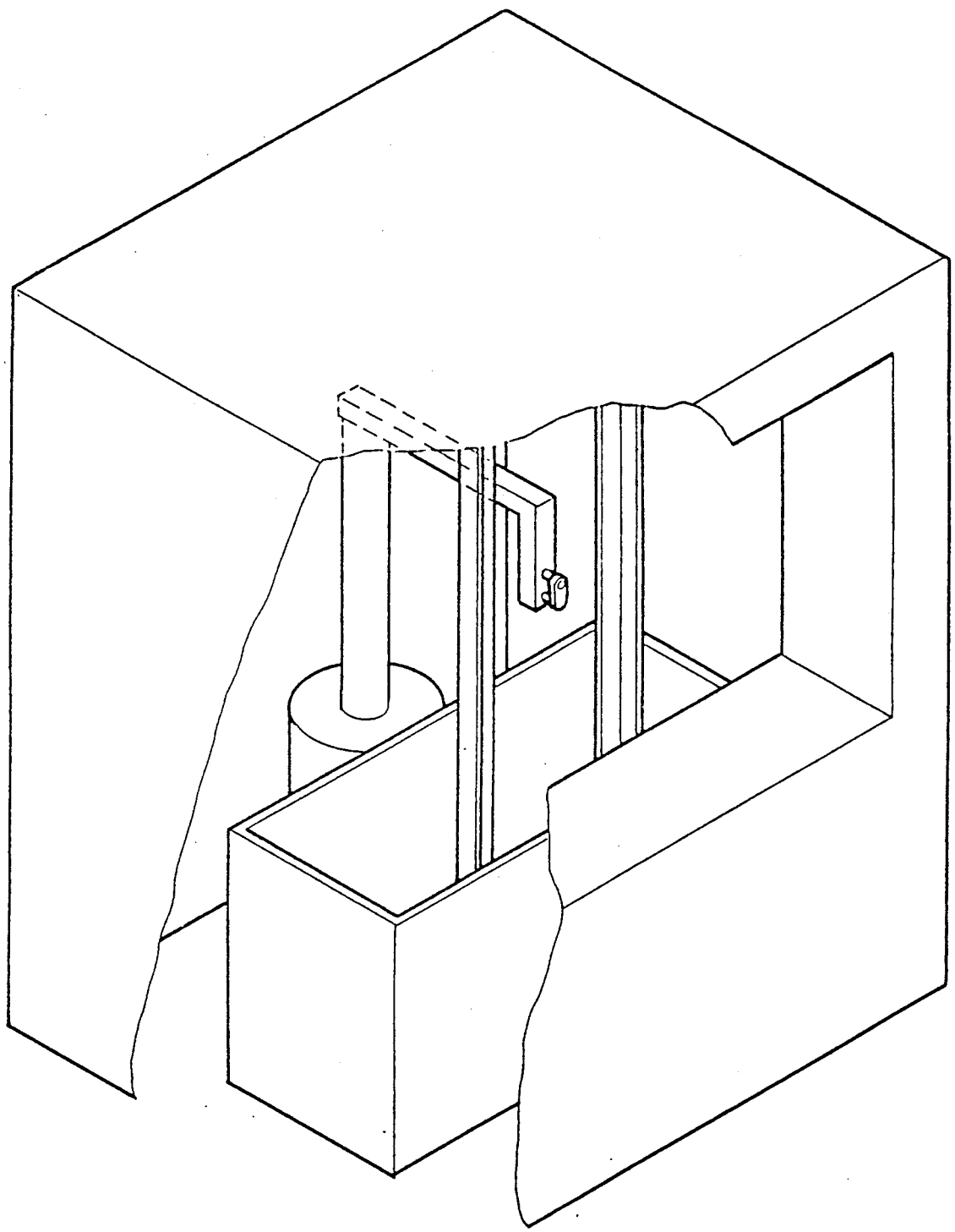
FIG. 9 shows the structure of a prior art solder leveler.
Figure 10:
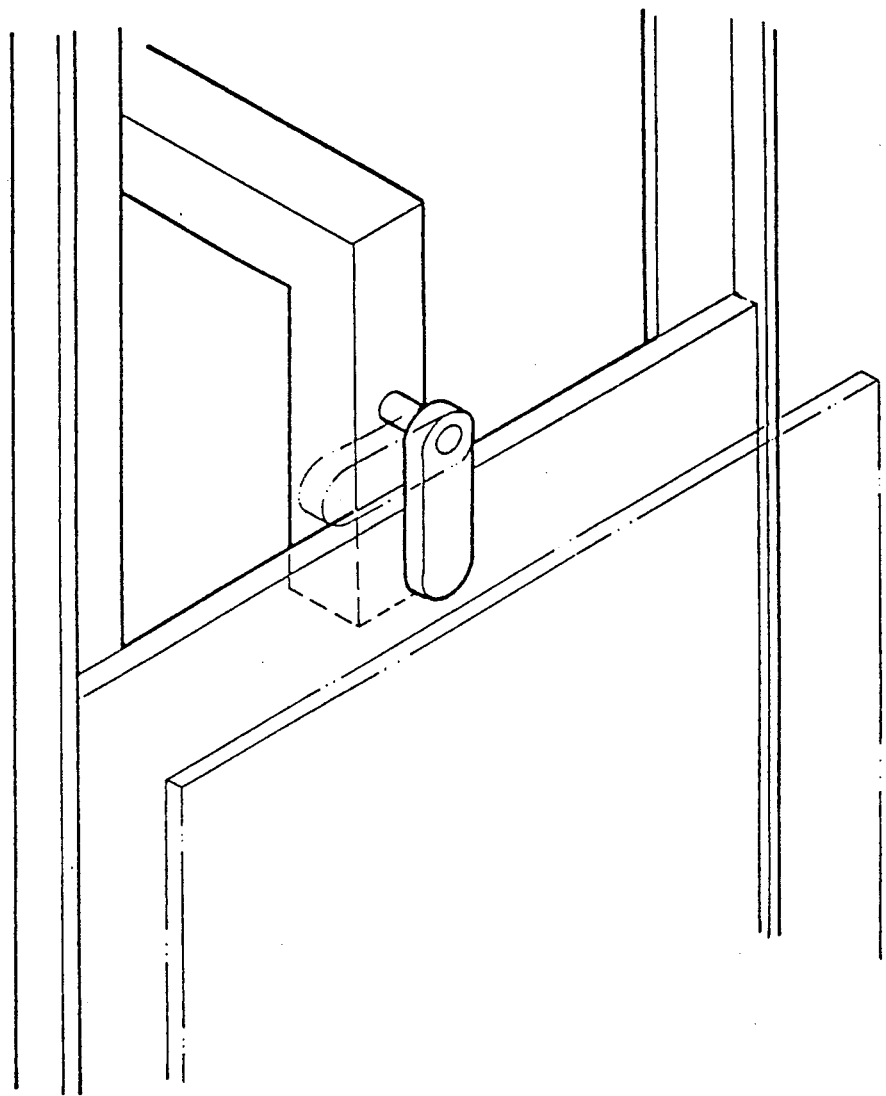
FIG. 10 shows how the printed circuit board is manually fed into the clamping unit of the prior art solder leveler.

When in operation, the horizontal pneumatic cylinder 22 first moves the downward-moving pneumatic cylinders 23 so as to engage the recesses 230 of the latter with the projections 434 of the lower clamps of the jig 4. Then the upward-moving pneumatic cylinders 24 are actuated to lift the upper clamp 44 while the downmoving pneumatic cylinders 23 press the lower clamp 43 thereby opening the jig 4. Hence, the tinned printed circuit board 6 is released and moved away by the left conveyer belt 3 whereas the right converyer belt 4 feeds an untinned printed circuit board into the jig 4 (see FIG. 6). Thereafter, the down-moving and upward-moving pneumatic cylinders 23 and 24 return to their positions causing the upper and lower clamps 44 and 43 to clamp the printed board 6 tightly and the elevated device 5 is driven to lift the jig 4 together with the printed circuit board 6. As the jig 4 is lifted upward, the blowing means 12 blow away the excess solder on the printed circuit board 6 clamped by the clamping unit at the lower position (see FIG. 7). When the jig 4 is lifted to a predetermined position, the revolving means 7 will rotate the jig 4 through an angle of 90 degrees thereby moving the unsoldered printed circuit board 6 to the lower position and the tinned printed circuit board 6 at a horizontal position. Subsequently, the elevated device 5 lowers the jig 4 so that the unsoldered printed circuit board 6 is lowered into the container 11 for soldering (see FIG. 8).

Although the present invention has been described with a certain degree of particularity, it is understood that the present disclosure is made by way of example only and that numerous changes in the detail of construction and the combination and arrangement of parts may be resorted to without departing from the spirit and scope of the invention as hereinafter claimed.

I claim:
1. A solder leveler comprising:
a solder trough assembly having a container with an open top, two blowing means arranged at opposite sides above the open top of said container, and two angular frames each mounted at opposite sides of said container;
two pneumatic rods each having an elongated case fitted on a respective said angular frame, wherein each case has mounted therein a horizontal pneumatic cylinder, a sliding member engaged with said horizontal pneumatic cylinder, a plurality of downward-moving pneumatic cylinders fixedly mounted on said sliding member, and four upward-moving pneumatic cylinders mounted in fixed position;
two conveyor belts mounted at opposite ends of said solder trough assembly respectively;
a jig mounted on said solder trough assembly having a shaft and a plurality of clamping units on said shaft;
an elevated device consisting of a left rack, a right rack and a transmission means, said left rack having a longitudinal groove thereon and two guides on an inner side thereof, said right rack having two guides on an inner side thereof, said transmission means having a sliding guide arranged at each side of said left rack, a bracket slidably mounted on the sliding guide, a first motor fitted on said bracket, a first upper gear mounted on an upper part of said left rack, a second upper gear mounted on an upper part of said right rack, a first lower gear mounted on a lower part of said left rack, a second lower gear mounted on a lower part of said left rack, a second lower gear mounted on a lower part of said right rack, a bracket mounted on top of said left rack for supporting a second motor, a shaft connecting the first and second upper gears, a first sliding block movably engaged with the guides of said left rack and connected with an axle of said first motor, a second sliding block movably engaged with the guides of said right rack and connected with guides for the axle of said first motor, a first chain engaged with the first upper gear and the first lower gear, and a second chain engaged with the second gear and the second lower gear.

* * * * *